United States Patent
Gardner et al.

[11] Patent Number: 6,110,786
[45] Date of Patent: Aug. 29, 2000

[54] SEMICONDUCTOR DEVICE HAVING ELEVATED GATE ELECTRODE AND ELEVATED ACTIVE REGIONS AND METHOD OF MANUFACTURE THEREOF

[75] Inventors: Mark I. Gardner, Cedar Creek; Jon Cheek, Round Rock; John Bush, Leander, all of Tex.

[73] Assignee: Advanced Micro Devices, Inc., Sunnyvale, Calif.

[21] Appl. No.: 09/061,409

[22] Filed: Apr. 16, 1998

[51] Int. Cl.⁷ .................................................. H01L 21/336
[52] U.S. Cl. ........................................................... 438/300
[58] Field of Search ................................. 438/300, 302, 438/301, 304; 257/336, 344, 382

[56] References Cited

U.S. PATENT DOCUMENTS

| | | | |
|---|---|---|---|
| 5,182,619 | 1/1993 | Pfiester | 257/382 |
| 5,721,443 | 2/1998 | Wu | 257/344 |
| 5,726,081 | 3/1998 | Lin et al. | 438/163 |
| 5,824,587 | 10/1998 | Krivokapic | 438/300 |
| 5,893,741 | 4/1999 | Huang | 438/300 |
| 5,902,125 | 5/1999 | Wu | 438/300 |
| 5,949,105 | 9/1999 | Moslehi | 257/336 |

Primary Examiner—Olik Chaudhuri
Assistant Examiner—William David Coleman

[57] ABSTRACT

A semiconductor device having an elevated gate electrode and elevated active regions and a process for manufacturing such a device is disclosed. In accordance with one embodiment a semiconductor device is formed by forming a gate insulating layer over a substrate and forming a photoresist block over the gate insulating layer. First portions of the gate insulating layer and first portions of the substrate adjacent the photoresist block are then removed to form a first elevated substrate region under the gate insulating layer and photoresist block. Edge portions of the photoresist block are then removed. Second portions of the gate insulating layer and portions of the first elevated substrate region adjacent the photoresist block are then removed to form second elevated substrate regions adjacent the photoresist block, and a dopant is implanted into the second elevated substrate regions to form source/drain regions, and the photoresist block is used to form a gate electrode. In accordance with another embodiment a semiconductor device is formed substantially as above, but the dopant is implanted at an angle relative to the substrate surface.

22 Claims, 4 Drawing Sheets

SEMICONDUCTOR DEVICE HAVING ELEVATED GATE ELECTRODE AND ELEVATED ACTIVE REGIONS AND METHOD OF MANUFACTURE THEREOF

FIELD OF THE INVENTION

The present invention is directed generally to semiconductor devices, and more particularly to semiconductor devices having an elevated gate electrode and elevated active regions and methods of manufacture thereof.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 101, which acts as a conductor, to which an input signal is typically applied via a gate terminal (not shown). Heavily doped source 103 and drain 105 regions are formed in a semiconductor substrate 107 and are respectively connected to source and drain terminals (not shown).

The source/drain regions 103 and 105 are lightly-doped-drain (LDD) structures. Each LDD structure includes a lightly-doped, lower conductivity region 106 near the channel region 109 and the heavily-doped, higher conductivity regions 103 and 105. Generally, the LDD structures are typically formed by implanting a first dopant into active regions adjacent the gate electrode 101 at relatively low concentration levels to form the lightly-doped regions 106; forming spacers 102 on sidewalls of the gate electrode 101; and implanting a second dopant into the active regions at higher concentration levels to form the heavily-doped regions 103 and 105. The substrate 107 is typically annealed to drive the dopant in the heavily-doped regions deeper into the substrate.

A channel region 109 is formed in the semiconductor substrate 107 beneath the gate electrode 101 and separates the source 103 and drain 105 regions. The channel is typically lightly doped with a dopant type opposite to that of the source 103 and drain 105 regions. The gate electrode 101 is physically separated from the semiconductor substrate 107 by an insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer.

As the semiconductor devices are scaled down (i.e., made smaller) in order to form a larger number of devices on a given surface area, the structure of the devices and fabrication techniques used to make such devices must be altered. For example, the transverse electric field generated in a MOS device typically increases. If the transverse electric field becomes sufficiently strong, it can give rise to hot carrier effects which can significantly degrade device performance. The problems associated with hot carrier effects are particularly pronounced in short channel devices (having, for example, submicron channel lengths) and serve to limit scaling down of semiconductor devices.

One important hot carrier effect is hot-carrier injection of electrons into the gate oxide and/or gate electrode. Hot carrier injection generally causes a deleterious gate current (when the electrons pass into the gate electrode) and an undesirable increase in the threshold voltage of the device (when the electrons are trapped in the gate oxide). Another important hot carrier effect is forward injection of electrons from the source to the drain. Forward injection of electrons generally causes a deleterious source-to-drain current (often referred to as a leakage current).

SUMMARY OF THE INVENTION

Generally, the present invention relates to semiconductor devices having elevated gate electrodes and elevated active regions and methods of manufacture thereof.

Consistent with the present invention a semiconductor device is formed by forming a gate insulating layer over a substrate and forming a photoresist block over the gate insulating layer. First portions of the gate insulating layer and first portions of the substrate adjacent the photoresist block are then removed to form a first elevated substrate region under the gate insulating layer and photoresist block. Edge portions of the photoresist block are then removed. Second portions of the gate insulating layer and portions of the first elevated substrate region adjacent the photoresist block are then removed to form second elevated substrate regions adjacent the photoresist block, and a dopant is implanted into the second elevated substrate regions to form source/drain regions, and the photoresist block is used to form a gate electrode. The dopant may be implanted straight at or at an angle to the substrate.

According to the present invention a semiconductor device comprises a substrate with a first elevated substrate region and second elevated substrate regions adjacent the first elevated substrate region, wherein the first elevated substrate region is higher than the second elevated substrate regions. A gate insulating layer is disposed over the first elevated substrate region, and a gate electrode is disposed over the gate insulating layer. Active regions are formed in the second elevated substrate regions adjacent the first elevated substrate region. Active regions may further be disposed in corner portions of the first elevated substrate region adjacent the second elevated substrate regions.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
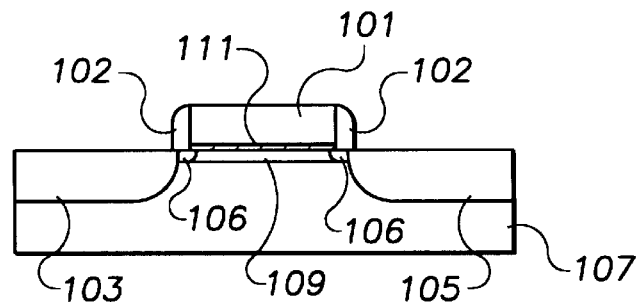
FIG. 1 illustrates components of a MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices (for example, MOS, CMOS and BiCMOS devices) which have active regions adjacent a gate electrode. The invention is believed to be particularly advantageous in applications where it is desirable to form an elevated gate electrode and elevated active regions. While the present invention is not so limited, an appreciation of various aspects of the invention is best gained through a discussion of various application examples of processes used to form such semiconductor devices.

FIGS. 2A–2I illustrate an exemplary process for fabricating a semiconductor device in accordance with one embodiment of the invention. In this exemplary process, an insulating layer 203 is formed on a substrate 201, typically a silicon substrate. The insulating layer 203 may, for example, be an oxide grown or deposited according to well-known techniques. The insulating layer 203 is typically used to insulate a photoresist block from the substrate 201 and may also be used to form a gate insulating layer if desired.

Figure 2A:
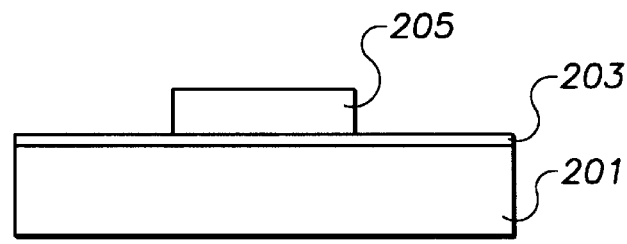
FIGS. 2A–2I illustrate an exemplary process in accordance with one embodiment of the invention.

Photoresist blocks 205 (only one of which is shown) are then formed over the insulating layer 203. The resultant structure is illustrated in FIG. 2A. The photoresist block 205 may be formed, for example, using well-known deposition, masking and etching techniques. The photoresist block 205 will be used to form an elevated gate electrode and elevated active regions on the substrate 201, as will be discussed below. The width of the photoresist block 205 is selected in consideration of the desired widths of the gate electrode and active regions. Suitable widths of the photoresist block range from about 0.15 to 0.25 microns. Suitable heights of the photoresist block 205 range from about 6000 to 15000 Angstroms for many applications.

Prior to forming the photoresist block 205 (e.g., before or after forming the insulating layer 203), background implants such as well implants, punchthrough implants, and threshold voltage implants may be performed to provide the background doping for the substrate 201. These implants may be performed using, for example, well-known techniques.

Figure 2B:
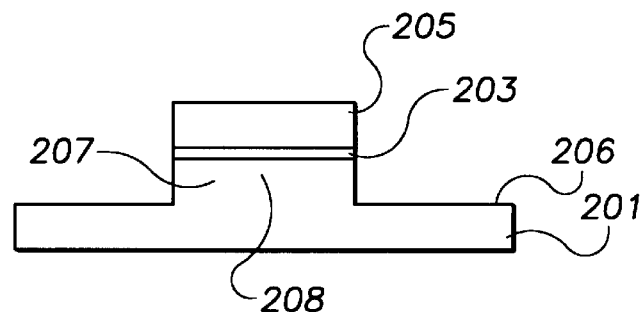

Portions of the insulating layer 203 and substrate 201 adjacent the photoresist block 205 are removed to form an elevated substrate region 207, as illustrated in FIG. 2B. The insulating layer 205 and substrate 201 portions may be removed using, for example, well-known etching techniques. The amount of substrate material that is removed is selected in consideration of the desired height of the elevated substrate region 207 relative to the adjacent substrate surface 206. Heights ranging from about 0.2 to 0.4 microns would be suitable for many applications.

Figure 2C:
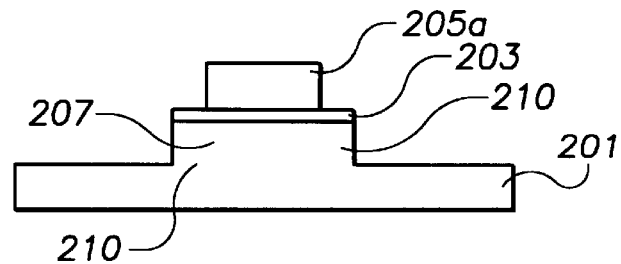
Figure 2D:
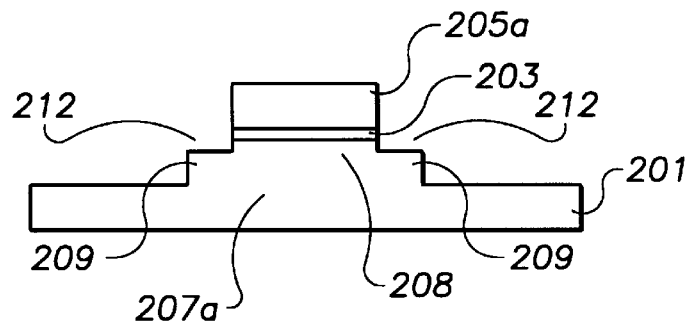

Edge portions of the photoresist block 205 are then removed to reduce the width of the photoresist block 205. This provides a photoresist block 205a which is narrower than the first elevated substrate region 207 as shown in FIG. 2C. The edge portions of the photoresist block 205 may be removed using, for example, photoresist trim etch techniques. In one case, photoresist trim etch is performed by over etching the photoresist block 205 using plasma etching techniques.

The photoresist block 205a will be used to form a gate electrode. Exposed portions 210 of the elevated substrate region 207 will be used to form elevated active regions adjacent the gate electrode. The amount of photoresist removed on each side of the block 205 is selected in consideration of the desired width of the elevated active regions and the gate electrode. Suitable amounts removed range from about 0.02 to 0.04 microns on each side for many applications. This leaves the remaining photoresist block 205a with a width ranging from about 0.12 to 0.16 microns and the exposed portions 210 of the elevated substrate regions 207 each with a width ranging from 0.02 to 0.04 microns.

After trimming the photoresist block 205, exposed portions of the insulating layer 203 and underlying portions of the elevated substrate region 207 are removed to form lower elevated substrate regions 209 adjacent the remaining elevated substrate region 207a. The insulating layer 203 and substrate portions may be removed using, for example, well-known techniques such as etching. The upper elevated substrate portion 207a generally defines the channel region width, while the lower elevated regions 209 will be used to define active regions. The amount of substrate removed to form the lower elevated portions 209 is typically selected in consideration of the desired spacing between the channel region 208 and the active regions of the lower elevated portions 209. Suitable amounts of silicon removed range from about 0.05 to 0.1 microns. This provides a recess 212 measured from the upper surface of the upper elevated portion 207a to the upper surfaces of the lower elevated portions 209 of about 0.05 to 0.1 microns. The resulting height of the lower elevated portions thus typically range from about 0.1 to 0.25 microns.

Figure 2E:
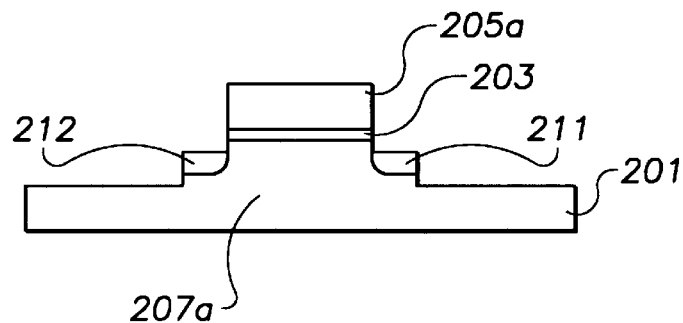

A dopant is then implanted into the lower elevated substrate regions 209 to form active regions 211 as illustrated in FIG. 2E. The active regions 211 may, for example, be used as source/drain regions in the device. The implant energy and dopant concentration may be chosen in consideration of the dopant material used, and the desired depth profile of the active regions 211. The conductivity type of the dopant used to form the active regions 211 depends on the type (e.g. NMOS or PMOS) of device being formed. For example, in an NMOS transistor the source/drain regions are formed by implanting an n-type dopant, such as arsenic or phosphorus. Correspondingly, in a PMOS transistor the source/drain regions are formed by implanting a p-type dopant, such as boron. In an exemplary process, the dopant is implanted to about half the depth of the lower elevated substrate regions 209. Suitable implant energies range from about 2 to 10 keV for many applications, while suitable dosages range from about 2E15 to 8E15 atoms/cm$^2$ ($2 \times 10^{15}$ to $8 \times 10^{15}$) in many applications.

Following the implant, the substrate 201 is typically annealed to activate the implanted dopant. During this anneal (as well as any subsequent heat treatment), the dopant tends to diffuse within the substrate 201. In particular, a small amount of the dopant may diffuse into the upper elevated substrate region 207a to form lightly-doped regions in corners of the elevated substrate portion 207a.

Figure 2F:
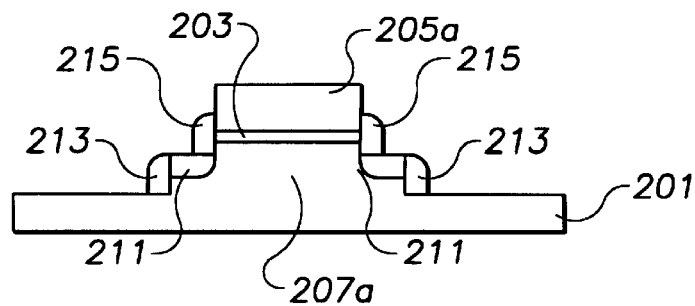

Spacers 213, 215 may then be formed adjacent sidewalls of the upper and lower elevated regions 207a and 209, as illustrated in FIG. 2F. The spacers may be formed using, for example, well-known deposition and etching techniques. The spacers may be used in fabrication steps such as silicidation, such that the applied metal is prevented from forming silicide where the silicon is covered by spacers 213, 215.

Figure 2G:
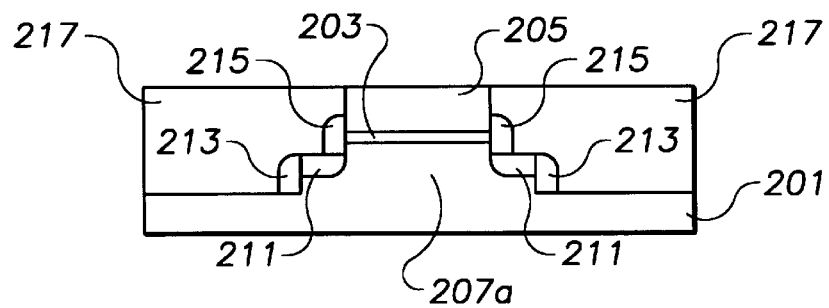

A dielectric layer 217 is formed over the substrate 201 and adjacent the photoresist block 205a. The dielectric layer 217 may be formed from a number of dielectric materials using well-known techniques. In the example embodiment, the dielectric layer 217 is formed by depositing a layer of dielectric material, such as oxide, and planarizing the deposited dielectric material with the upper surface of the photoresist block 205a. The deposition and planarization may be performed using, for example, well-known deposition and chemical-mechanical polishing (CMP) techniques. The resultant structure is shown in FIG. 2G.

The photoresist block 205a may then be selectively removed leaving an opening in the dielectric layer 217 used to form a gate electrode. Selective removal of the photoresist block 205e may be done using, for example, well-known etching techniques.

Figure 2H:
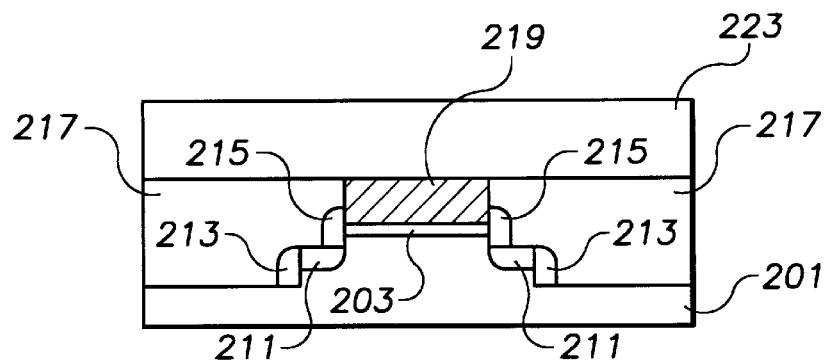

A gate electrode 219 is formed in the opening and over the oxide layer 203, as illustrated in FIG. 2H. The gate electrode 219 may be formed from any suitable material, such as metal or polysilicon. The gate electrode 219 may, for example, be formed by depositing metal or polysilicon over the dielectric layer 217 and in the opening in dielectric layer 217 and planarizing the deposited gate electrode material using, for example, well-known chemical-mechanical polishing techniques. In this case, the insulating layer 203 is used as the gate insulating layer. Optionally, the insulating layer 203 may be removed in whole or in part prior to forming the gate electrode 219. In this case, a different dielectric material may be deposited or grown over the elevated substrate portion 207a and used as the gate insulating layer.

Figure 2I:
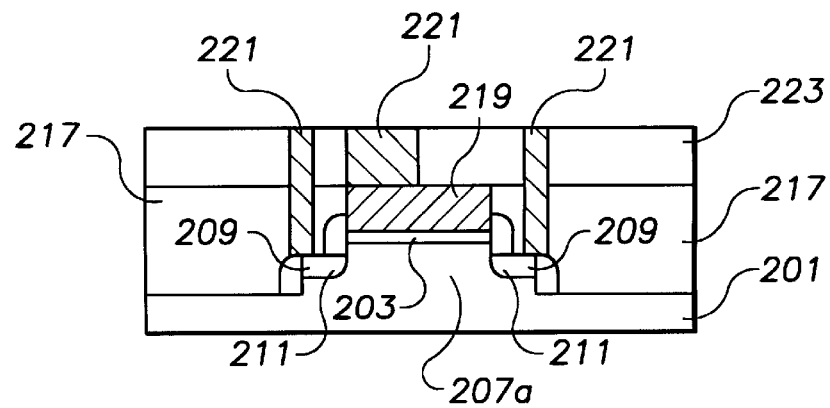

Contacts 221 to the active regions 211 and gate electrode 219 may be formed as shown in FIG. 2I. The contacts may be formed by, for example, depositing a dielectric material 223 (e.g., an oxide) over the substrate 201, etching openings in the dielectric material 223 and dielectric layer 217, if needed, to expose the active region 211 and gate electrode 219, and filling the openings with a conductive material, such as a metal, using deposition techniques.

Thus, the device illustrated in FIG. 2I includes a substrate 201 with an upper elevated substrate region 207a and active regions 211 in lower elevated substrate regions 209 adjacent the upper elevated substrate region 107a. A gate insulating layer is disposed over the upper elevated substrate region 207a and a gate electrode 219 is disposed over the gate insulating layer 203. Dielectric layers 217 and 223 are disposed over the substrate 201. Contacts 221 to the active regions and to the gate electrode 219 are formed in openings in the dielectric layers 217 and 223. As noted above, the lower elevated substrate regions 209 may have a width ranging from about 0.02 to 0.04 microns, and the upper elevated substrate region 107a may be about 0.05 to 0.1 micron higher than the lower elevated substrate regions 209. The active regions 211 may be disposed between an upper surface of the lower elevated substrate regions 209 and about half the depth of the lower elevated substrate regions 209.

Fabrication of the semiconductor device may continue with well-known processing steps, such as intermetal level layer formation, to complete the device structure.

Figure 3A:
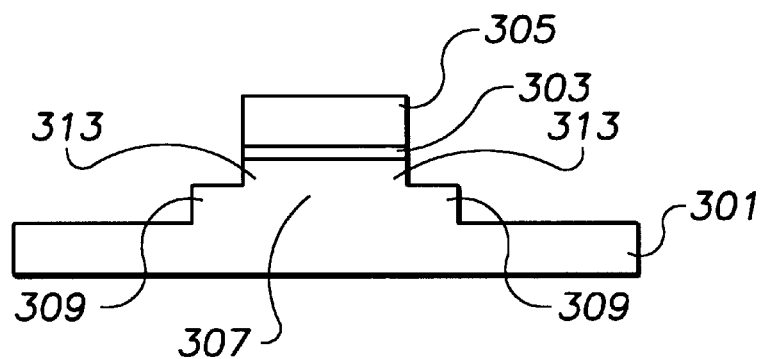
FIGS. 3A–3B illustrate an exemplary process in accordance with another embodiment of the invention.
Figure 3B:
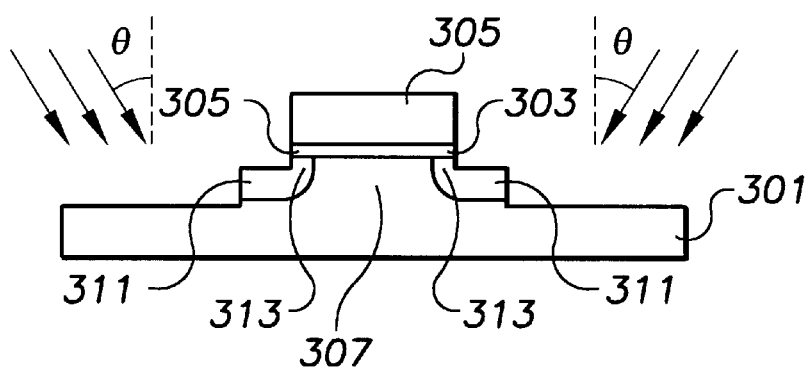

FIGS. 3A–3B illustrates another embodiment of the invention in which an elevated gate electrode and elevated active regions are formed using an angled active region implant. In this exemplary embodiment, the processing steps discussed above with respect to FIGS. 2A–2D are carried out to form a transistor structure having an elevated substrate region 307, lower elevated substrate regions 309 adjacent the substrate regions 307, an insulating layer 303 over the elevated substrate region 307, and a photoresist block 305 over the insulating layer 303. The resultant structure is illustrated in FIG. 3A.

An angled implant is then performed to form active regions 311 in the lower elevated substrate region 309 and corner portions 313 of the upper elevated substrate region 307. The active regions 311 may, for example, be used as source/drain regions in the semiconductor device. The angled dopant implant may, for example, be performed by rotating the semiconductor substrate 301 while performing an angled implant or through the use of a multi-step angled implant. The implant angle $\theta$ as well as energy and dopant concentration of the implanted dopant is typically selected in consideration of the desired profile of the active regions 311. Suitable implant energies and dopant dosages range from about 2 to 10 keV and 2E15 to 8E15 atoms/cm$^2$, respectively, for many applications. Suitable implant angles $\theta$ range from 20 to 60 degrees for many applications.

Using this angled implant technique, larger amounts of dopant may be formed in the corner portions 313 of the elevated substrate region 307 as compared to using a straight dopant implant shown in the earlier embodiment. The dopant concentration in the corner portions 313 as compared to the lower elevated substrate portions 309 can be controlled using the angle of the implant. For example, the amount of dopant in the corner portions 313 of the elevated substrate region 307 increases with increasing implant angle $\theta$. In this manner, lightly-doped regions of the active regions 311 may be formed in the corner portions 313 of the upper elevated substrate region 307 by dopant implant not just through dopant diffusion.

Fabrication of the semiconductor device may, for example, continue with the processing steps described above with respect to FIGS. 2F–2I, to complete the device structure.

Using the above processes, semiconductor devices having elevated gate electrodes and elevated source/drain regions may be formed. The above processes further allow, for example, the source/drain regions to be recessed relative to the channel region. The recessed source/drain regions can, for example, reduce hot carrier injection effects and enhance reliability of the device.

The present invention is applicable to the fabrication of a number of different devices which may benefit from having an elevated gate electrode and source/drain regions. Such devices include, but are not limited to, MOS, CMOS, and BiCMOS structures. Accordingly, the present invention cannot be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed, upon review of the present specification. The claims are intended to cover such modifications and devices.

What is claimed is:

1. A process of fabricating a semiconductor device, comprising:

forming a first elevated substrate region over a substrate;

removing edge portions of the first elevated substrate region and forming second elevated substrate regions adjacent the first elevated substrate region;

forming a gate electrode, and an underlying gate insulator layer, over the first elevated substrate region; and forming active regions in the second elevated substrate regions.

2. The process of claim 1, further comprising forming a gate insulating layer over the substrate before forming the first elevated substrate region.

3. The process of claim 2, wherein forming the gate insulating layer includes forming an oxide layer.

4. The process of claim 2, further comprising forming a photoresist block over the gate insulating layer before forming the first elevated substrate region.

5. The process of claim 4, wherein forming the first elevated substrate region includes removing first portions of the gate insulating layer and first portions of the substrate adjacent the photoresist block.

6. The process of claim 5, wherein removing the first portions of the gate insulating layer and first portions of the substrate includes forming a first elevated substrate region having a height ranging from about 0.2 to 0.4 microns.

7. The process of claim 5, further including removing edge portions of the photoresist block from over edge portions of the first elevated substrate region after forming the first elevated substrate region and before forming the second elevated substrate regions.

8. The process of claim 7, wherein the edge portions of the photoresist block are removed using a photoresist trim etch technique.

9. The process of claim 7, wherein removing the edge portions of the photoresist block includes removing edge portions having a width ranging from about 0.02 to 0.04 microns.

10. The process of claim 7, wherein removing the edge portions of the photoresist block includes narrowing the photoresist block to a width ranging from about 0.12 to 0.16 microns.

11. The process of claim 7, wherein forming the second elevated substrate regions includes removing part of the edge portions of the first elevated substrate region.

12. The process of claim 4, wherein using the photoresist block to form a gate electrode includes:

forming a dielectric layer over portions of the substrate adjacent the photoresist block;

removing the photoresist block to leave an opening in the dielectric layer over the gate insulating layer; and forming a gate electrode in the opening.

13. The process of claim 1, wherein the second elevated substrate regions has a depth ranging from about 0.1 to 0.3 microns.

14. The process of claim 1, wherein forming the active regions includes implanting a dopant into the second elevated substrate regions.

15. The process of claim 14, wherein the dopant is implanted to about half a depth of the second elevated substrate regions.

16. The process of claim 14, wherein implanting the dopant includes implanting a dopant with a concentration ranging from about 2E15 to 8E15 atoms/cm$^2$.

17. The process of claim 14, wherein implanting the dopant includes implanting a dopant with an energy ranging from about 2 to 10 KEV.

18. The process of claim 14, wherein implanting the dopant includes implanting the dopant at an angle ranging from about 20 to 60 degrees relative to the substrate surface.

19. The process of claim 18, wherein implanting the dopant at an angle includes forming LDD source/drain regions each having a heavily-doped region in a corresponding second elevated substrate region and a lightly-doped region in a corresponding first elevated substrate region.

20. The process of claim 1, further including forming spacers adjacent the first and second elevated substrate regions.

21. The process of claim 20, wherein the spacers are formed from a material selected from oxide and nitride.

22. A process of fabricating a semiconductor device, comprising:

forming a photoresist block over a substrate;

etching first portions of the substrate adjacent the photoresist block to form a first elevated substrate region under photoresist block;

etching edge portions of the photoresist block over edge portions of the first elevated substrate region;

etching part of the edge portions of the first elevated substrate region to form second elevated substrate regions adjacent the first elevated substrate region;

implanting a dopant into the second elevated substrate regions to form source/drain regions; and using the photoresist block to form a gate electrode.

* * * * *